United States Patent
Horiguchi et al.

(10) Patent No.: US 9,337,751 B2
(45) Date of Patent: May 10, 2016

(54) PIEZOELECTRIC POWER GENERATOR

(71) Applicant: MURATA MANUFACTURING CO., LTD., Nagaokakyo-Shi, Kyoto-fu (JP)

(72) Inventors: Chikahiro Horiguchi, Nagaokakyo (JP); Hitoshi Sakaguchi, Nagaokakyo (JP)

(73) Assignee: MURATA MANUFACTURING CO., LTD., Nagaokakyo-Shi, Kyoto-Fu (JP)

( * ) Notice: Subject to any disclaimer, the term of this patent is extended or adjusted under 35 U.S.C. 154(b) by 299 days.

(21) Appl. No.: 13/963,097

(22) Filed: Aug. 9, 2013

(65) Prior Publication Data

US 2013/0328446 A1 Dec. 12, 2013

Related U.S. Application Data

(63) Continuation of application No. PCT/JP2012/059851, filed on Apr. 11, 2012.

(30) Foreign Application Priority Data

May 9, 2011 (JP) .................................. 2011-103961

(51) Int. Cl.
*H02N 2/18* (2006.01)
*H01L 41/113* (2006.01)

(52) U.S. Cl.
CPC ............ *H02N 2/186* (2013.01); *H01L 41/1136* (2013.01); *H02N 2/188* (2013.01)

(58) Field of Classification Search
CPC H02N 1/186; H01L 41/1136; G01P 15/0907; G01P 15/0922
USPC .................................................. 310/329, 338
See application file for complete search history.

(56) References Cited

U.S. PATENT DOCUMENTS 7,415,874 B2    8/2008  Mancosu et al.
8,024,974 B2 *  9/2011  Bharti .................. A61B 5/4818
                                                         381/67

(Continued)

FOREIGN PATENT DOCUMENTS

CN      101272109 A     9/2008
CN      101814860 A     8/2010

(Continued)

OTHER PUBLICATIONS

Sameh Ben Ayed et al.; "Shape Improvement for Piezoelectric Energy Harvesting Applications"; 2009 IEEE International Conference on Signals, Circuits and Systems, Piscataway, NJ, USA, Nov. 6, 2009.

(Continued)

*Primary Examiner* — Shawki S Ismail
*Assistant Examiner* — Bryan Gordon
(74) *Attorney, Agent, or Firm* — Arent Fox LLP

(57) ABSTRACT

Provided is a piezoelectric power generator that has an overall compact size and in which a plurality of piezoelectric elements having a low natural frequency of vibration and that generate a large amount of power can be arranged in a compact manner.
A piezoelectric power generator includes a first and second piezoelectric elements, which each have a cantilever structure, fixed to the top of two opposing side walls of a housing. The first piezoelectric element and the second piezoelectric element are arranged so as to oppose each other in an alternating manner and respectively have a first weight and a second weight joined to free ends thereof. Unused spaces formed below the fixed end sides of the piezoelectric elements are used as spaces in which the weights can move by positioning one of the weights under the fixed end side of the other of the piezoelectric elements.

20 Claims, 9 Drawing Sheets

(56) References Cited

U.S. PATENT DOCUMENTS

| | | | |
|---|---|---|---|
| 2007/0145861 A1* | 6/2007 | Tanner | A45F 3/08 310/339 |
| 2007/0228889 A1* | 10/2007 | Terje et al. | 310/339 |
| 2008/0129147 A1* | 6/2008 | Thiesen | B60C 23/041 310/319 |
| 2010/0170332 A1* | 7/2010 | Kammann | B60C 23/041 73/146.5 |
| 2010/0270889 A1* | 10/2010 | Xu et al. | G01P 15/09 310/329 |
| 2010/0295419 A1* | 11/2010 | Fujii | H01L 41/1136 310/339 |

FOREIGN PATENT DOCUMENTS

| | | |
|---|---|---|
| JP | 7-49388 A | 2/1995 |
| JP | 7-245970 A | 9/1995 |
| JP | 11-136964 A | 5/1999 |
| JP | 2007-527681 A | 9/2007 |
| JP | 2010-273408 A | 12/2010 |
| KR | 10-2010-0049730 A | 5/2010 |

OTHER PUBLICATIONS

European Search Report and European Search Opinion issued for corresponding application EP 12 78 2667, dated Aug. 6, 2014.

International Search Report and Written Opinion of PCT/JP2012/059851, date of mailing: Jul. 17, 2012.

* cited by examiner

PRIOR ART

PRIOR ART

PIEZOELECTRIC POWER GENERATOR

CROSS REFERENCE TO RELATED APPLICATIONS

The present application is a continuation of PCT/JP2012/059851 filed Apr. 11, 2012, which claims priority to Japanese Patent Application No. 2011-103961, filed May 9, 2011, the entire contents of each of which are incorporated herein by reference.

FIELD OF THE INVENTION

The present invention relates to piezoelectric power generators that generate power by using the piezoelectric effect and in particular relates to piezoelectric power generators that employ a power-generating element having a cantilever (cantilever beam) structure.

BACKGROUND OF THE INVENTION

In Patent Document 1, as illustrated in FIG. 17, there is disclosed a piezoelectric power generator having a cantilever structure in which one end of a power-generating element 100 is fixed to a fixing member 101 and a weight 102 is attached to the other end of the power-generating element 100, which is a free end. The power-generating element 100 is formed by piezoelectric bodies 104 and 105 being adhered to the two surfaces of a metal plate 103, and, when the power-generating element 100 is seen from above, the power-generating element 100 has the shape of an isosceles triangle whose width gradually becomes narrower from the fixed end to the free end. In this case, a bending stress applied to the power-generating element 100 can be made uniform in the length direction and therefore the power-generating element 100 can generate charge substantially uniformly along its entire length and the power-generating efficiency can be improved compared to the case in which a rectangular power-generating element is used.

Incidentally, there are power generators that are used in a vibrational range of comparatively low frequencies, such as power generators that for example utilize the vibration that occurs when a person is walking or the vibration of a bicycle or an automobile. If the natural frequency of the power-generating element is made to be close to the frequency of such a low-frequency external vibration, the power-generating element can be caused to resonate and the amount of power generated is increased. The generated amount of power P of a power-generating element is determined by a constant A, which is determined by the piezoelectric material that forms the piezoelectric body, a stress σ applied to the piezoelectric body and the volume V of the piezoelectric body as expressed by the following equation.

$$P = A \times \sigma^2 \times V$$

However, if only a single power-generating element 100 is used as in Patent Document 1, there is not likely to be a large increase in the amount of generated power. If the length of the power-generating element is increased, the stress is increased and therefore it is possible to increase the amount of power generated with even a single element, but this opposes size reduction.

In Patent Document 2, a piezoelectric power generator is disclosed in which a plurality of power-generating elements having different resonant frequencies are supported in a cantilever manner. This piezoelectric power generator, as illustrated in FIG. 18, includes a plurality of power-generating elements 201 to 203, which each have one end fixed to a base portion 200 and another end acting as a free end, and weights 204 to 206, which are attached to the free ends of the power-generating elements 201 to 203, and the lengths of the power-generating elements 201 to 203 are different from one another. In this piezoelectric power generator, the resonant frequencies of the individual power-generating elements are made to be different from each other in order to generate power over a wide range of frequencies, but it is possible to increase the amount of power generated at a particular frequency if the resonant frequencies of the individual power-generating elements are made to be the same as each other. However, the plurality of power-generating elements 201 to 203 are arranged parallel to one another and therefore a large amount of space is occupied and the power generator cannot be formed with a small size.

Patent Document 1: Japanese Unexamined Patent Application Publication No. 11-136964

Patent Document 2: Japanese Unexamined Patent Application Publication No. 7-245970

SUMMARY OF THE INVENTION

An object of the present invention is to provide a piezoelectric power generator that has an overall compact size and in which a plurality of piezoelectric elements that have a low natural frequency of vibration and that generate a large amount of power can be arranged in a compact manner.

In order to achieve the above object, the present invention provides a piezoelectric power generator that includes a fixing member having first and second fixing portions that oppose each other across a space, a first piezoelectric element having one end portion that is fixed to the first fixing portion and another end portion that extends toward the second fixing portion, a first weight that is joined to the other end portion of the first piezoelectric element, a second piezoelectric element having one end portion that is fixed to the second fixing portion and another end portion that extends toward the first fixing portion, and a second weight that is joined to the other end portion of the second piezoelectric element. The first piezoelectric element and the second piezoelectric element are arranged with a space therebetween in a width direction, a part of the first weight, which is joined to the other end portion of the first piezoelectric element, is positioned below the one end portion side of the second piezoelectric element, and a part of the second weight, which is joined to the other end portion of the second piezoelectric element, is positioned below the one end portion side of the first piezoelectric element.

When piezoelectric elements having a cantilever structure are arranged laterally, the amount of displacement of a free end to which a weight is joined is large, whereas the displacement of a portion in the vicinity of a fixed end is very small. Consequently, there is unused space (dead space) below the vicinity of the fixed end. In particular, in the case where a large weight is joined to the free end of a piezoelectric element in order to produce a low frequency, the size of the unused space increases in proportion to the size of the weight. Consequently, in the present invention, a plurality of piezoelectric elements having a cantilever structure are arranged so as to oppose each other in an alternating manner and the unused space is effectively used by positioning one of the weights under the fixed end side of another one of the piezoelectric elements. As a result, the power generator can be reduced in size while making the natural frequency of vibration low and securing an amount of generated power.

Piezoelectric element of the present invention refers to an element having a structure formed by adhering a piezoelectric body having electrodes to one or both main surfaces of a vibrating plate such as a metal plate, a silicon substrate or a resin substrate. In the case where a metal plate is used, the metal plate can double as the ground electrode of the piezoelectric element.

In the case where the fixing member is formed of for example a box-shaped housing, the first piezoelectric element (including the first weight) and the second piezoelectric element (including the second weight) can be accommodated inside the housing in a compact manner if two opposing walls of the housing are used as the first and second fixing portions.

In a case where the second piezoelectric element is formed of a pair of elements and the pair of elements of the second piezoelectric element are arranged on both sides in the width direction with the first piezoelectric element interposed therebetween, it is preferable that the first weight be formed so as to protrude from the other end portion of the first piezoelectric element toward both sides in the width direction such that the two end portions of the first weight are positioned below the one end portion sides of the pair of elements of the second piezoelectric element, that the second weight be joined so as to connect the other end portions of the pair of elements of the second piezoelectric element to each other, and that a central portion of the second weight be positioned below the one end portion side of the first piezoelectric element. In this case, the first piezoelectric element and the second piezoelectric element can interdigitate with each other like the teeth of combs and space can be used efficiently and the structure can be made compact.

The first piezoelectric element and the second piezoelectric element may be each formed of a plurality of elements, the plurality of elements forming the first piezoelectric element and the plurality of elements forming the second piezoelectric element may be arranged so as to interdigitate with each other in an alternating manner, one first weight may be joined so as to connect the other end portions of the plurality of elements forming the first piezoelectric element to each other, and one second weight may be joined so as to connect the other end portions of the plurality of elements forming the second piezoelectric element to each other. In this case, the number of piezoelectric elements can be increased and therefore the amount of generated power is increased.

The other end portion of the first piezoelectric element may be at a position lower than the one end portion of the second piezoelectric element so that the first weight does not come into contact with the one end portion side of the second piezoelectric element, and the other end portion of the second piezoelectric element may be at a position lower than the one end portion of the first piezoelectric element so that the second weight does not come into contact with the one end portion side of the first piezoelectric element. Even in a state where an external vibration is not acting, the free end portions of the first piezoelectric element and the second piezoelectric element bend downward due to the weights of the weights. Consequently, in the case where the displacement due to external vibration is smaller than the displacement due to gravitational acceleration, even if weights having flat upper surfaces are used, the weights can be prevented from interfering with the piezoelectric elements.

A protrusion, which is joined to a lower surface of the other end portion of the first piezoelectric element, may be formed on an upper surface of the first weight and an upper surface of the first weight, except for the protrusion, may be formed so as to be lower than the protrusion, and a protrusion, which is joined to a lower surface of the other end portion of the second piezoelectric element, may be formed on an upper surface of the second weight and the upper surface of the second weight, except for the protrusion, may be formed so as to be lower than the protrusion. In this case, protruding and recessed portions are formed on the upper surfaces of the weights and therefore, even in the case where the displacement due to external vibration is larger than the displacement due to gravitational acceleration, the weights can be prevented from interfering with the piezoelectric elements.

A resonant frequency of bending vibration of the first piezoelectric element including the first weight and a resonant frequency of bending vibration of the second piezoelectric element including the second weight may be the same as each other. In the case where the resonant frequency of the first piezoelectric element and the resonant frequency of the second piezoelectric element are different from each other, power generation can be performed over a wide range of frequencies, but if the resonant frequencies are made to be the same, the amount of power generated at a particular frequency can be doubled. In addition, common output terminals and a single rectifier circuit can be used, thereby simplifying the circuit.

The first piezoelectric element and the first weight and the second piezoelectric element and the second weight are each preferably formed so as to have line symmetry about a central axis lying in the center in the width direction. Although it is possible for the first piezoelectric element and the first weight or the second piezoelectric element and the second weight to have asymmetrical shapes, this would cause torsional vibration to be generated in the first piezoelectric element and the second piezoelectric element and as a result the amount of power generated would be reduced. In contrast, if line symmetrical shapes are adopted, torsion is not liable to occur in the piezoelectric elements, bending vibration is efficiently generated and the amount of power generated can be increased.

As described above, according to the present invention, a plurality of cantilever-type piezoelectric elements are arranged so as to oppose each other in an alternating manner and one of the weights is positioned below the fixed end side of another one of the piezoelectric elements and therefore the unused spaces below the vicinities of the fixed ends of the piezoelectric elements can be effectively used as spaces in which the weights can move. As a result, the power generator can be reduced in size while making the natural frequency of vibration low and securing an amount of generated power.

DETAILED DESCRIPTION OF THE PREFERRED EMBODIMENTS OF THE INVENTION

First Embodiment

Figure 1:
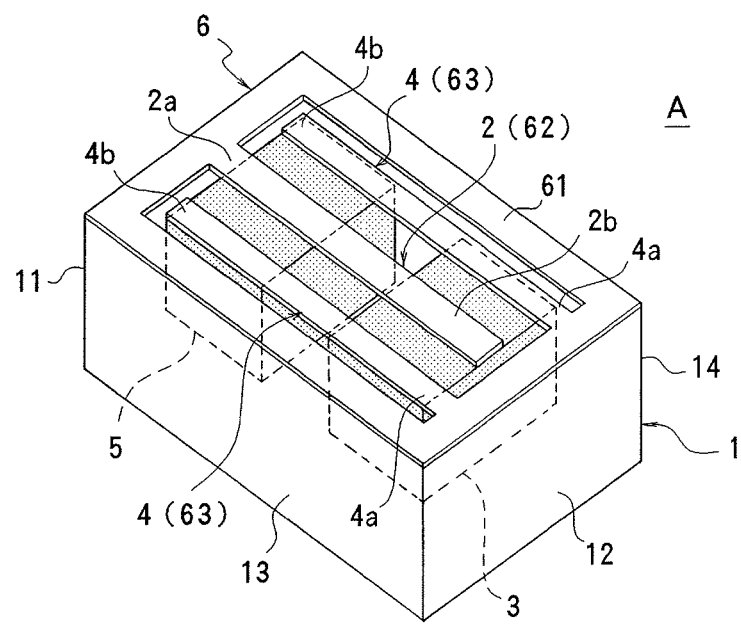
FIG. 1 is a perspective view of a first embodiment of a piezoelectric power generator according to the present invention.
Figure 2:
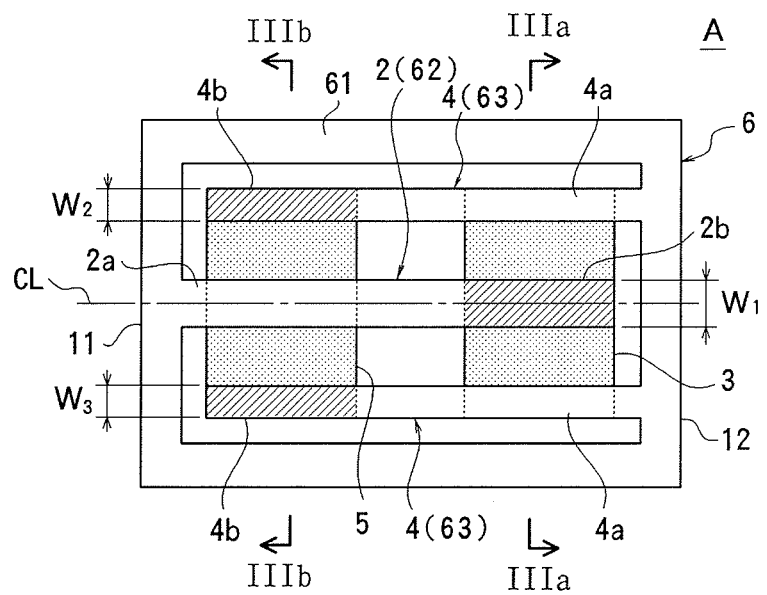
FIG. 2 is a plan view of the piezoelectric power generator illustrated in FIG. 1.
Figure 3:
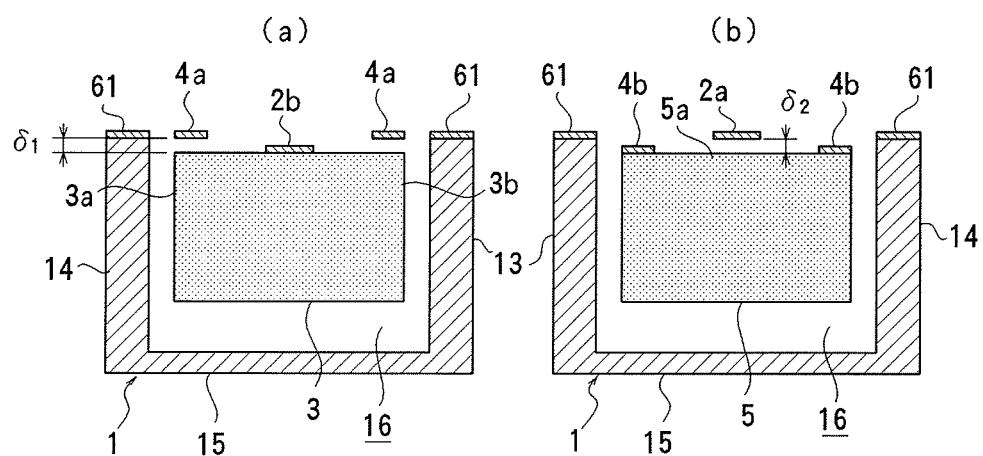
FIG. 3 illustrates a sectional view taken along line IIIa-IIIa of FIG. 2 and a sectional view taken along line IIIb-IIIb of FIG. 2.

FIGS. 1 to 3 illustrate a first embodiment of a piezoelectric power generator according to the present invention. A piezoelectric power generator A of this embodiment includes a box-shaped housing 1. The housing 1 includes four side walls 11 to 14 and one bottom wall 15. An internal space 16 is formed by the side walls 11 to 14 and the bottom wall 15. First and second side walls 11 and 12, which are two side walls that oppose each other among the four side walls 11 to 14 of the housing 1, respectively serve as a first fixing portion and a second fixing portion. A cover, which is not illustrated, is provided on an upper surface of the housing 1, thereby closing the internal space of the housing 1. The housing 1 is a fixing member of the present invention and the side wall 11 and the side wall 12 are respectively first and second fixing portions of the present invention.

One end portion (fixed end portion) 2a of a first piezoelectric element 2 is fixed to an upper surface of the first side wall 11, another end portion (free end portion) 2b of the first piezoelectric element 2 extends toward the second side wall 12, and a first weight 3 is joined to that other end portion 2b. One end portions (fixed end portions) 4a of a pair of second piezoelectric elements 4 are fixed to an upper surface of the second side wall 12, other end portions (free end portions) 4b of the second piezoelectric elements 4 extend toward the first side wall 11, and a second weight 5 is joined to those other end portions 4b. That is, the first piezoelectric element 2 and the second piezoelectric elements 4 extend parallel to each other in opposite directions in an alternating manner. In FIG. 2, regions shaded with diagonal lines are portions where the weights 3 and 5 and the piezoelectric elements 2 and 4 are joined to each other. The first weight 3 and the second weight 5 are accommodated inside the internal space 16 of the housing 1 so as to be freely displaceable in the vertical direction. The second piezoelectric elements 4 are arranged either side of the first piezoelectric element 2 in the width direction at the same interval. The second piezoelectric elements 4 have the same length and the same width. The first piezoelectric element 2 including the first weight 3 and the second piezoelectric elements 4 including the second weight 5 are formed so as to have line symmetry about a central axis CL lying in the center in the width direction.

The first piezoelectric element 2 and the second piezoelectric elements 4 may each be a unimorph element in which a piezoelectric body (not illustrated) is adhered to one main surface of a vibrating plate or may each be a bimorph element in which a piezoelectric body is adhered to both main surfaces of a vibrating plate. Electrodes are formed on both surfaces of the piezoelectric body and the piezoelectric body is polarized in the thickness direction. In addition to a metal plate, an elastic plate such as a silicon substrate or a glass epoxy substrate may be used.

The first weight 3, which is joined to the free end 2b of the first piezoelectric element 2, is formed so as to be wider than the free end 2b of the first piezoelectric element 2 such that end portions 3a and 3b of the first weight 3 on either side in the width direction are positioned below the fixed ends 4a side of the pair of second piezoelectric elements 4. Here, the second weight 5 is joined so as to connect the two free ends 4b of the second piezoelectric elements 4 and is positioned below the fixed end 2a side of the first piezoelectric element 2. The free end 2b of the first piezoelectric element 2 and the free ends 4b of the second piezoelectric elements 4 bend downward due to the weights of the first weight 3 and the second weight 5 as illustrated in FIGS. 3(a) and 3(b) in a natural state in which no external vibration is being applied. Consequently, there is a gap δ1 in the vertical direction between the two end portions 3a and 3b of the first weight 3 and the fixed ends 4a of the second piezoelectric elements 4 and there is a gap δ2 in the vertical direction between a central portion 5a of the second weight 5 and the fixed end 2a of the first piezoelectric element 2.

In this embodiment, a vibrating plate 6, which forms the first piezoelectric element 2 and the second piezoelectric elements 4, is formed of a single metal plate. That is, a frame portion 61 of the vibrating plate 6, which was processed by being for example pressed or etched from a single metal plate, is bonded to the upper surfaces of the four side walls 11 to 14 of the housing 1 as illustrated in FIG. 1. In the vibrating plate 6, a rectangular first beam portion 62 and rectangular second beam portions 63, which extend in opposite directions from the frame portion 61, are formed in an integrated manner. The first piezoelectric element 2 is formed by adhering a piezoelectric body to one or both main surfaces of the first beam portion 62 and the second piezoelectric elements 4 are formed by adhering piezoelectric bodies to one or both main surfaces of the second beam portions 63.

Figure 4:
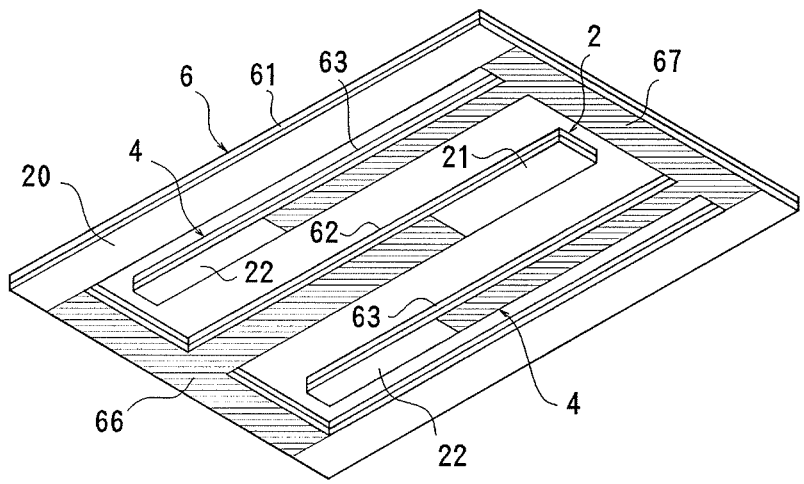
FIG. 4 is a perspective view in which an example of a vibrating plate is seen from below.

Piezoelectric bodies may be individually adhered to regions of the first beam portion 62 and the second beam portions 63, excluding the portions to which the weights are to be joined, or a piezoelectric body may be formed over the entire surface of the vibrating plate 6, prior to processing of the beam portions 62 and 63, and electrodes may be patterned such that electrodes are not formed at places corresponding to where the weights will be joined and places corresponding to the third and fourth side walls 13 and 14, and then the vibrating plate 6 and the piezoelectric body may be subjected to processing simultaneously. FIG. 4 is a perspective view in which an example of the vibrating plate 6, which has the piezoelectric body 20 adhered to the entirety of the lower surface thereof, is seen from below and places indicated using hatching are output electrodes 66 and 67 patterned on the lower surface of the piezoelectric body 20. The output electrodes 67 of the second piezoelectric elements 4 are connected to each other. The vibrating plate 6 is used as a ground electrode. The output electrodes 66 and 67 are not formed on portions of the lower surfaces of the free ends of the first and second piezoelectric elements 2 and 4 and the first weight 3 and the second weight 5 are respectively fixed to these non-electrode-forming portions 21 and 22.

Figure 5:
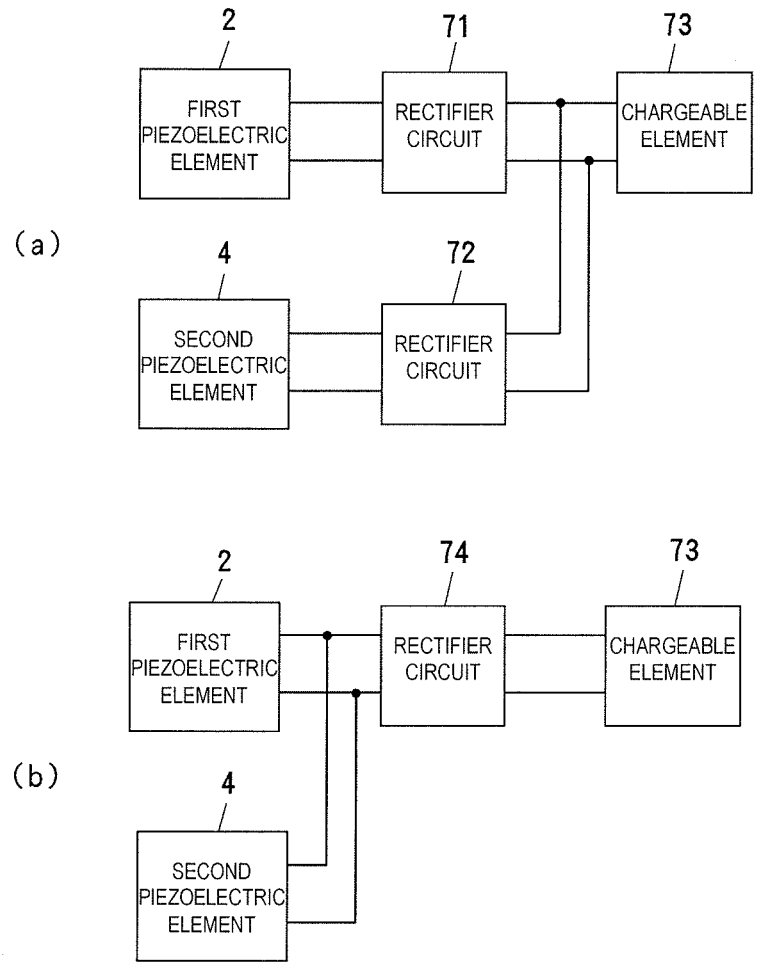
FIG. 5 illustrates circuit diagrams in which a rectifier circuit and a chargeable element are connected to piezoelectric elements.

In the case where the resonant frequencies of the first and second piezoelectric elements 2 and 4 (including the weights) are different from each other, as illustrated in FIG. 5(a), charge generated by the first piezoelectric element 2 and charge generated by the second piezoelectric elements 4 are rectified by separate rectifier circuits 71 and 72 and a chargeable element 73 is charged. In the case where the resonant frequencies of the first and second piezoelectric elements 2 and 4 (including the weights) are the same as each other, as illustrated in FIG. 5(b), charge generated by the first piezoelectric element 2 and charge generated by the second piezoelectric elements 4 are rectified by a single rectifier circuit 74 and the chargeable element 73 is charged. Rectifier circuits and chargeable elements are publicly known and therefore detailed description thereof will be omitted.

Figure 6:
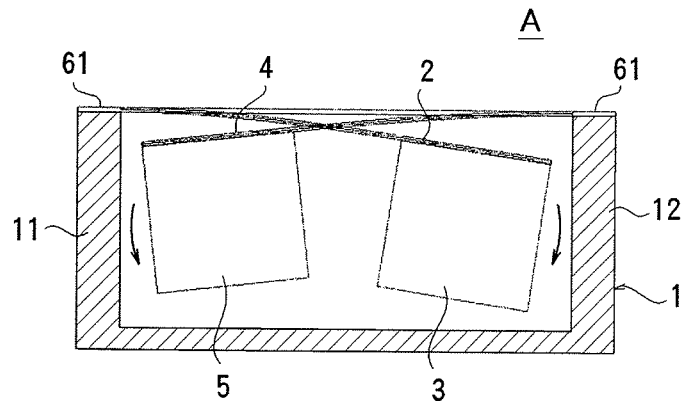
FIG. 6 is a sectional view illustrating displacement of a first weight and a second weight when a certain acceleration acts in a downward direction.

FIG. 6 illustrates displacement at a time when an acceleration acts on the first weight 3 and the second weight 5 in the downward direction. The first piezoelectric element 2 is bent into an upwardly convex shape by the first weight 3 and electricity resulting from this bending stress is generated in the piezoelectric element 2. The second piezoelectric elements 4 are bent into an upwardly convex shape by the second weight 5 and electricity resulting from this bending stress is generated in the piezoelectric elements 4. The first weight 3 is positioned below the fixed end 4a side of the second piezoelectric elements 4 and the second weight 5 is positioned below the fixed end 2a side of the first piezoelectric element 2 and therefore unused spaces formed below the fixed ends 2a and 4a of the piezoelectric elements 2 and 4 can be effectively utilized as spaces in which the first weight 3 and the second weight 5 can move and a piezoelectric power generator A having a compact overall size can be realized. In the case where the displacement due to the external vibration is smaller than the displacement due to gravitational acceleration, even though the first weight 3 and the second weight 5, which have flat upper surfaces, are used, the first weight 3 can be displaced without interfering with the second piezoelectric elements 4 and the second weight 5 can be displaced without interfering with the first piezoelectric element 2. In FIG. 6, a state is illustrated in which the first piezoelectric element 2 and the second piezoelectric elements 4 are both displaced downward, and in the case where the resonant frequencies of the piezoelectric elements 2 and 4 (including the weights) are different from each other, the first piezoelectric element 2 and the second piezoelectric elements 4 are individually displaced.

Figure 7:
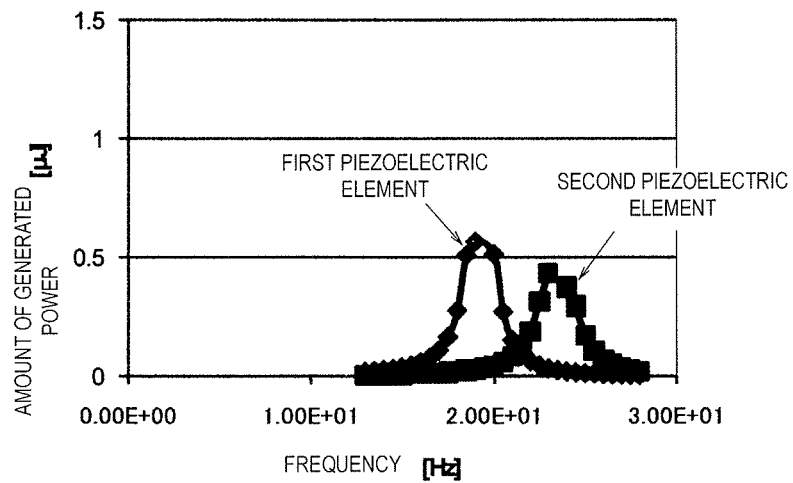
FIG. 7 illustrates the relationships between the amounts of power generated by piezoelectric elements and frequency when an acceleration is applied from the outside in the case where the resonant frequencies of a first piezoelectric element and a second piezoelectric element are different from each other.

FIG. 7 illustrates the relationships between the amounts of power generated by the first piezoelectric element 2 and the second piezoelectric elements 4 and frequency when an acceleration of 0.1 G acts from the outside. Here, a width W1 of the first piezoelectric element 2 and widths W2 and W3 of the second piezoelectric elements 4 satisfy the relationship W2+W3=1.5×W1 (here, W2=W3). The lengths of the piezoelectric elements 2 and 4 are the same and the weights of the first weight 3 and the second weight 5 are the same. In this case, the resonant frequency of the first piezoelectric element 2 (including the first weight 3) is somewhat lower than the resonant frequency of the second piezoelectric elements 4 (including the second weight 5) and therefore the peaks of the amounts of power generated by the piezoelectric elements 2 and 4 occur at different frequencies. Consequently, it is preferable that the individual rectifier circuits 71 and 72 be used to perform rectification as illustrated in FIG. 5(a).

Figure 8:
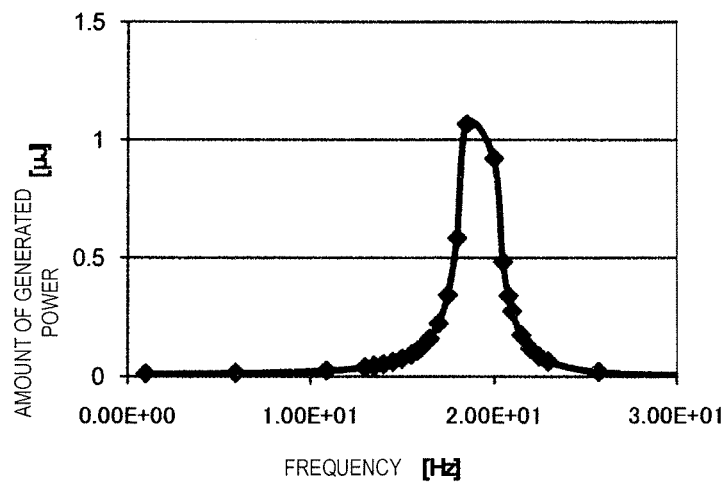
FIG. 8 illustrates the relationships between the amounts of power generated by piezoelectric elements and frequency when an acceleration is applied from the outside in the case where the resonant frequencies of the first piezoelectric element and the second piezoelectric element are the same as each other.

FIG. 8 illustrates the relationships between the amounts of power generated by the piezoelectric elements 2 and 4 and frequency in the case where W1=W2+W3. The other conditions are the same as those in FIG. 7. In this case, the resonant frequency of the first piezoelectric element 2 and the resonant frequency of the second piezoelectric elements 4 are the same as each other and therefore the peaks of the amounts of power generated by the piezoelectric elements 2 and 4 can be made to coincide with each other. That is, the total amount of power generated at a certain frequency can be increased approximately two-fold. In this case, the piezoelectric elements 2 and 4 have the same characteristics and therefore electrodes can be shared by the elements and the charge generated by the piezoelectric elements 2 and 4 can be rectified using the same rectifier circuit 74 as illustrated in FIG. 5(b).

Second Embodiment

Figure 9:
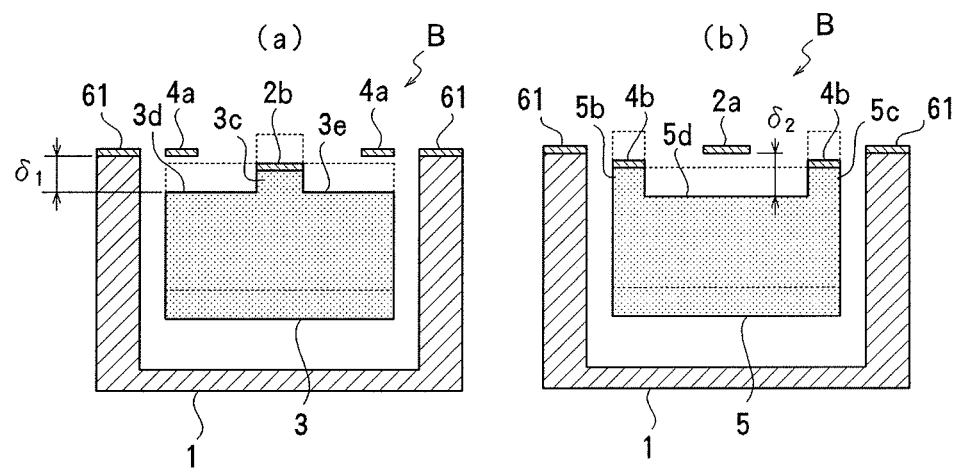
FIG. 9 is a sectional view of parts of weights of a second embodiment of a piezoelectric power generator according to the present invention.

FIG. 9 illustrates a second embodiment of a piezoelectric power generator according to the present invention. In a piezoelectric power generator B of this embodiment, parts the same as those in the first embodiment are denoted by the same symbols and repeated description thereof is omitted. FIG. 9(a) is a sectional view of a part that corresponds to FIG. 3(a) and FIG. 9(b) is a sectional view of a part that corresponds to FIG. 3(b). In this embodiment, a protrusion 3c is formed on an upper surface of a central portion of the first weight 3 and step portions 3d and 3e, which are a step lower than the protrusion 3c, are formed on either side. The protrusion 3c of the first weight 3 is fixed to the lower surface of the free end 2b of the first piezoelectric element 2, and the step portions 3d and 3e are arranged below the fixed ends 4a side of the second piezoelectric elements 4. In addition, protrusions 5b and 5c are formed on the upper surfaces of both end portions of the second weight 5 and a recess 5d, which is a step lower, is formed between the protrusions 5b and 5c. The protrusions 5b and 5c of the second weight 5 are fixed to the lower surfaces of the free ends 4b of the second piezoelectric elements 4, and the recess 5d is arranged below the fixed end 2a side of the first piezoelectric element 2.

In the piezoelectric power generator B, the gap δ1 in the vertical direction between the step portions 3d and 3e and the fixed ends 4a of the second piezoelectric elements 4 and the gap δ2 in the vertical direction between the recess 5d and the fixed end 2a of the first piezoelectric element 2 can be larger than in the first embodiment and therefore even if the first piezoelectric element 2 and the second piezoelectric elements 4 are displaced by a large amount in the vertical direction as illustrated by the broken lines, the first weight 3 does not come into contact with the second piezoelectric elements 4 due to the step portions 3d and 3e and the second weight 5 does not come into contact with the first piezoelectric element 2 due to the recess 5d. Consequently, even in the case where displacement due to an external vibration is larger than displacement due to gravitational acceleration, the weights and the piezoelectric elements can be prevented from interfering with each other. In this embodiment, since it is possible to allow the first piezoelectric element 2 and the second piezoelectric elements 4 to bend by a larger amount, the amount of electricity generated can be increased.

Third Embodiment

Figure 10:
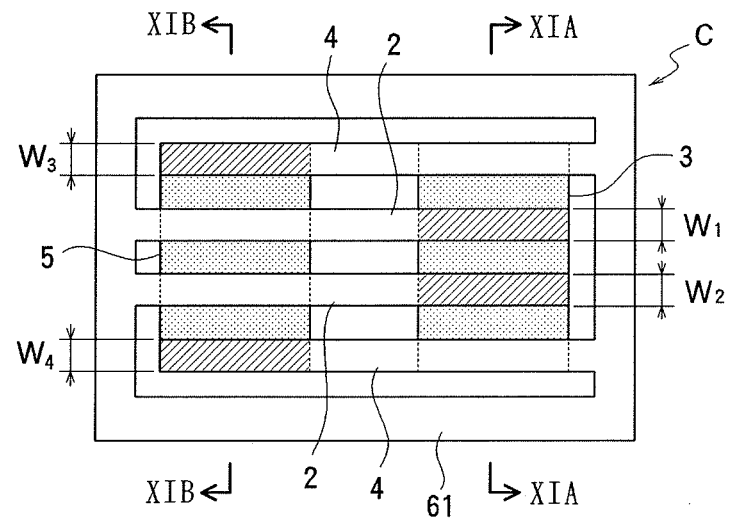
FIG. 10 is a plan view of a third embodiment of a piezoelectric power generator according to the present invention.
Figure 11:
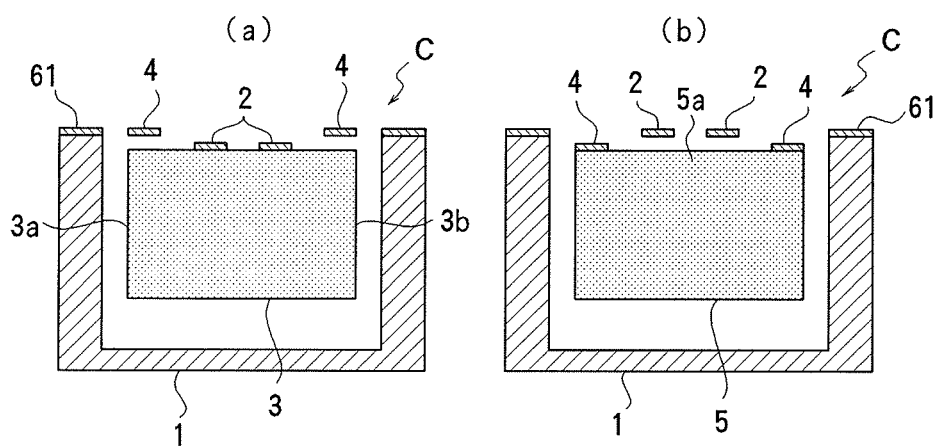
FIG. 11 illustrates a sectional view taken along line XIA-XIA and a sectional view taken along line XIB-XIB of FIG. 10.

FIGS. 10 and 11 illustrate a third embodiment of a piezoelectric power generator according to the present invention. In a piezoelectric power generator C of this embodiment, parts the same as those in the first embodiment are denoted by the same symbols and repeated description thereof is omitted. This embodiment is different from the first embodiment in that the first piezoelectric element is formed of a pair of elements 2. The first piezoelectric elements 2 are positioned between the pair of second piezoelectric elements 4. The first weight 3 is fixed so as to connect the free ends of the first piezoelectric elements 2 to each other and the end portions 3a and 3b of the first weight 3 on either side in the width direction are positioned below, but without touching, the fixed end sides of the second piezoelectric elements 4. The second weight 5 is fixed so as to connect the free ends of the second piezoelectric elements 4 to each other and the central portion 5a of the second weight 5 is positioned below, but without touching, the fixed end sides of the first piezoelectric elements 2. Similarly to as in the second embodiment (FIG. 9), protrusions and recesses may be provided on and in the upper surfaces of the first weight 3 and the second weight 5.

The widths W1 and W2 of the first piezoelectric elements 2 (here, W1=W2) and the widths W3 and W4 of the second piezoelectric elements 4 (here, W3=W4) may be different (W1 and W2≠W3 and W4) or may be the same (W1=W2=W3=W4). In the case where W1 and W2≠W3 and W4, the peaks of the amounts of generated power occur at different frequencies as illustrated in FIG. 7. In the case of W1=W2=W3=W4, the resonant frequencies of the first piezoelectric elements 2 (including the weight) and the resonant frequencies of the second piezoelectric elements 4 (including the weight) are the same and the amount of power generated at a certain frequency can be doubled as illustrated in FIG. 8.

In this embodiment, the first piezoelectric elements 2 and the second piezoelectric elements 4 are both formed of a pair of elements and therefore when the first weight 3 and the second weight 5 vibrate vertically, torsion in first piezoelectric elements 2 and the second piezoelectric elements 4 can be suppressed and bending vibration can be caused to be efficiently generated.

Fourth Embodiment

Figure 12:
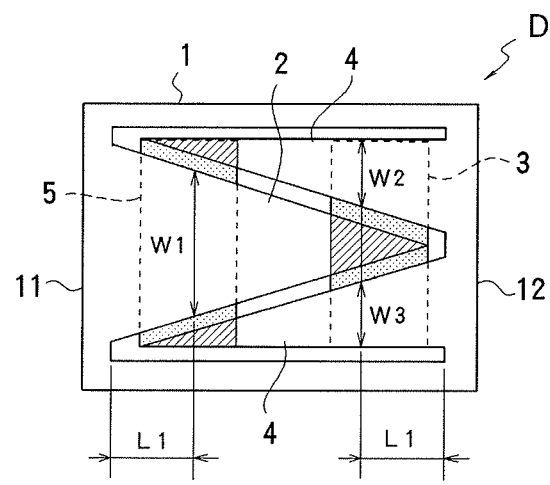
FIG. 12 is a plan view of a fourth embodiment of a piezoelectric power generator according to the present invention.

FIG. 12 illustrates a fourth embodiment of a piezoelectric power generator according to the present invention. In a piezoelectric power generator D of this embodiment, when seen from above, the first piezoelectric element 2 has the shape of an isosceles triangle that becomes gradually narrower from one end portion (fixed end) to the other end portion (free end) and the second piezoelectric elements 4 each have the shape of a right-angled triangle having a diagonal side that is parallel to a diagonal side of the first piezoelectric element 2. The piezoelectric elements 2 and 4 each have a triangular shape having a top that tapers in an acute angle shape, but may instead have a trapezoid shape having a top of a certain width. In FIG. 12, portions shaded with diagonal lines are where the weights 3 and 5 and the piezoelectric elements 2 and 4 are joined to each other.

In this embodiment, when the width of the first piezoelectric element 2 at a position a distance L1 from the first side wall 11 is W1 and the widths of the second piezoelectric elements 4 at positions the same distance L1 from the second side wall 12 are W2 and W3, it is preferable that the following relation be set.

$$W1=W2+W3$$

In particular, it is preferable that W1:W2:W3=2:1:1. If they are set in this way, the resonant frequency of the first piezoelectric element 2 (including the first weight 3) and the resonant frequency of the second piezoelectric elements 4 (including the second weight 5) become substantially equal to each other and the amount of power generated at a certain frequency can be doubled.

Fifth Embodiment

Figure 13:
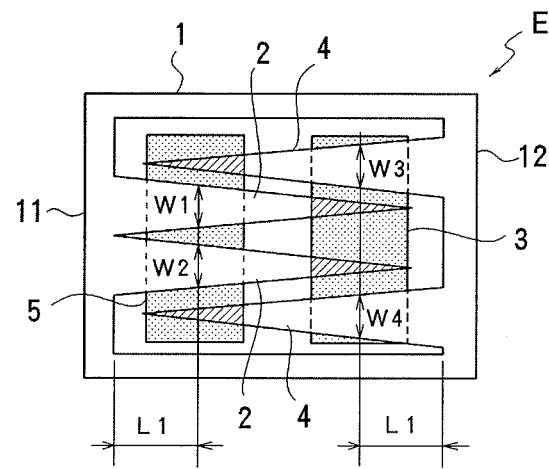
FIG. 13 is a plan view of a fifth embodiment of a piezoelectric power generator according to the present invention.

FIG. 13 illustrates a fifth embodiment of a piezoelectric power generator according to the present invention. A piezoelectric power generator E of this embodiment is characterized in that the first piezoelectric element is formed of a pair of isosceles-triangle-shaped elements 2 and the second piezoelectric element is formed of a pair of isosceles-triangle-shaped elements 4, which are joined to the first piezoelectric elements 2.

In this embodiment, when the widths of the first piezoelectric elements 2 at positions a distance L1 from the first side wall 11 are W1 and W2 and the widths of the second piezoelectric elements 4 at positions the same distance L1 from the second side wall 12 are W3 and W4, it is preferable that W1+W2=W3+W4 and in particular by making W1=W2=W3=W4, the resonant frequency of the first piezoelectric elements 2 (including the first weight 3) and the resonant frequency of the second piezoelectric elements 4 (including the second weight 5) can be made substantially equal to each other. By forming the first piezoelectric elements 2 out of a pair of elements, it becomes less likely that torsion will be generated in the first piezoelectric elements 2 and the power generation efficiency is improved.

Sixth Embodiment

Figure 14:
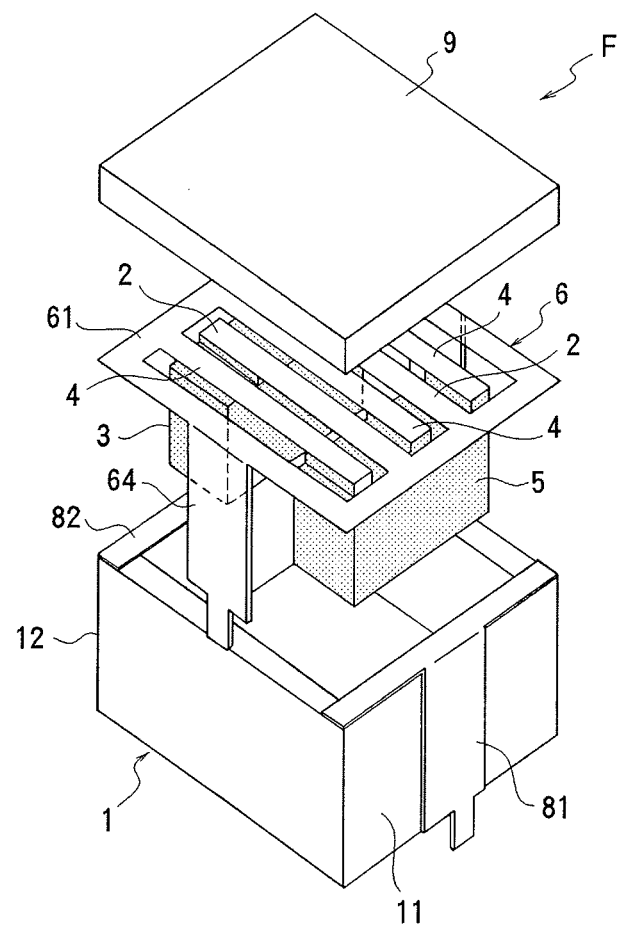
FIG. 14 is an exploded perspective view of a sixth embodiment of a piezoelectric power generator according to the present invention.
Figure 15:
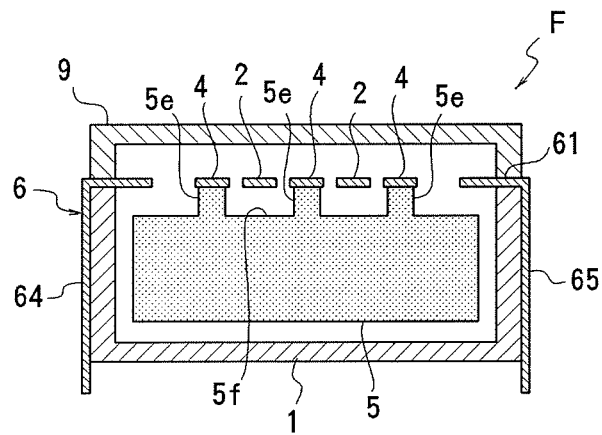
FIG. 15 is a longitudinal sectional view in which part of a second weight of the piezoelectric power generator illustrated in FIG. 14 is cut.
Figure 16:
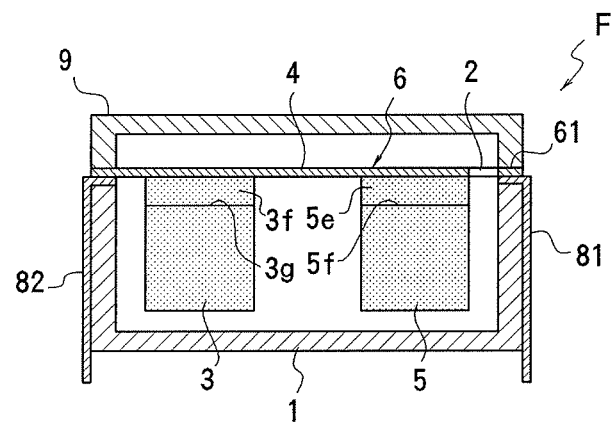
FIG. 16 is a longitudinal sectional view in which the piezoelectric power generator illustrated in FIG. 14 is cut along a central line connecting a first and a second weight thereof.
Figure 17:
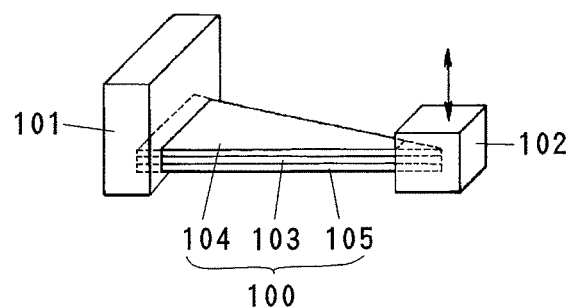
FIG. 17 is a perspective view of a piezoelectric power generator described in Patent Document 1.
Figure 18:
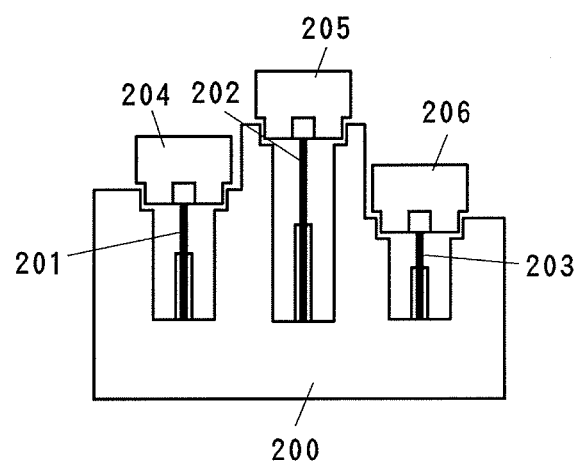
FIG. 18 is a sectional view of a piezoelectric power generator described in Patent Document 2.

FIGS. 14, 15 and 16 illustrate a sixth embodiment of a piezoelectric power generator according to the present invention. In a piezoelectric power generator F, output terminals (hot side terminals) 81 and 82 are respectively fixed to the upper surfaces of the two opposing side walls 11 and 12 of the box-shaped housing 1 and the vibrating plate 6, which forms the piezoelectric elements, is arranged on top of the output terminals 81 and 82. Output electrodes (denoted by symbols 66 and 67 in FIG. 4) formed on the lower surface of the vibrating plate 6 are respectively joined to the output terminals 81 and 82 and electrically connected thereto. A plurality of comb-tooth-shaped piezoelectric elements 2 and 4 are formed by the vibrating plate 6. In this embodiment, the first piezoelectric element is formed of two elements 2, the second piezoelectric element is formed of three elements 4 and these elements interdigitate with each other in an alternating manner. By increasing the number of elements, the amount of power generated can be further increased. Output terminals (ground side terminals) 64 and 65, which extend downward along the side walls of the housing 1, are formed in an integrated manner on either side of the frame portion 61 of the vibrating plate 6 in the width direction. Thus, the output terminals 81 and 82 and 64 and 65 are respectively provided on the four side walls of the housing 1.

As illustrated in FIG. 15, a plurality of protrusions 5e, which are joined to the lower surfaces of the free ends of the second piezoelectric elements 4, are formed on the upper surface of the second weight 5, and two recesses 5f are formed on parts of the upper surface where the protrusions 5e are not provided. The fixed end sides of the first piezoelectric elements 2 are positioned above the recesses 5f and therefore even when the second weight 5 is displaced vertically, the second weight 5 does not interfere with the first piezoelectric elements 2. Protrusions 3f and recesses 3g are formed for the first weight 3, similarly to as for the second weight 5, and the protrusions 3f are joined to the lower surfaces of the free ends of the first piezoelectric elements 2. Although a state is illustrated in FIG. 15 and FIG. 16 in which the piezoelectric elements 2 and 4 are not bent, in a normal state in which no external vibration is acting, the piezoelectric elements 2 and 4 may bend downward due to gravity acting on the first weight 3 and the second weight 5.

A cap 9 is adhered to the upper surface of the housing 1, thereby sealing the internal space of the housing 1. Accordingly, the piezoelectric power generator F can be handled as an individual electronic component having a sealed structure and can be mounted on a printed wiring board similarly to other electronic components.

A piezoelectric power generator according to the present invention is not limited to the above-described embodiments and can of course be modified in various ways. The shapes of the first weight and the second weight are not limited. For example, one end portion of each of the first weight and the second weight may be lengthened in opposite directions from the portions where the weights are joined to the first piezoelectric element and the second piezoelectric element so as to reduce the space formed between the weights. In this case, since the two weights come closer together, the amount of unused space can be reduced. The shapes of the first weight and the second weight have line symmetry about a central axis CL lying in the center in the width direction, but shapes having line symmetry do not have to be adopted. However, since there is a possibility of a torsion mode being generated in the piezoelectric elements, it is preferable that the center of gravity of a weight be arranged along a line running through the center of a piezoelectric element in the width direction.

REFERENCE SIGNS LIST

A to F piezoelectric power generator
1 housing (fixing member)
11, 12 side wall (first, second fixing portion)
2 first piezoelectric element
2a one end portion (fixed end)
2b other end portion (free end)
3 first weight
3a, 3b end portion
4 second piezoelectric element
4a first end portion (fixed end)
4b other end portion (free end)
5 second weight
5a central portion
6 vibrating plate
61 frame portion
62 first beam portion
63 second beam portion
66, 67 electrode
71, 72, 74 rectifier circuit
73 chargeable element
81, 82 output terminal
9 cover (cap)

The invention claimed is:

1. A piezoelectric power generator comprising:
a box-shaped housing including first and second walls that oppose each other across a space of the housing,
a first piezoelectric element having a fixed end portion that is fixed to the first wall of the housing and a free end portion that extends toward the second wall of the housing;
a second piezoelectric element having a fixed end portion that is fixed to the second wall of the housing and a free end portion that extends toward the first wall of the housing;
a first weight coupled to a bottom surface of the free end portion of the first piezoelectric element, such that at least a portion of the first weight is disposed in the space of the housing; and
a second weight coupled to a bottom surface of the free end portion of the second piezoelectric element, such that at least a portion of the second weight is disposed in the space of the housing,
wherein an upper surface of the first weight comprises a protrusion coupled to the bottom surface of the free end portion of the first piezoelectric element, and
wherein an upper surface of the second weight comprises a protrusion coupled to the bottom surface of the free end portion of the second piezoelectric element.

2. The piezoelectric power generator according to claim 1, wherein the first piezoelectric element and the second piezoelectric element extend in a direction parallel to one another.

3. The piezoelectric power generator according to claim 2, wherein the first piezoelectric element and the second piezoelectric element are arranged with a space therebetween in a width direction of the box-shaped housing.

4. The piezoelectric power generator according to claim 1, wherein the second piezoelectric element comprises a pair of elements that extend in a direction parallel to the first piezoelectric element.

5. The piezoelectric power generator according to claim 4, wherein the first piezoelectric element extends between the pair of elements of the second piezoelectric element.

6. The piezoelectric power generator according to claim 5, wherein the first weight comprises a width such that at least a portion of the first weight is disposed below at least a portion of each of the pair of elements of the second piezoelectric element, respectively, and
wherein the second weight is coupled to the bottom surfaces of the free end portions of each of the pair of elements of the second piezoelectric element, such that the second weight is disposed below at least a portion of the first piezoelectric element.

7. A piezoelectric power generator comprising:
a box-shaped housing including first and second walls that oppose each other across a space of the housing,
a first piezoelectric element having a fixed end portion that is fixed to the first wall of the housing and a free end portion that extends toward the second wall of the housing;
a second piezoelectric element having a fixed end portion that is fixed to the second wall of the housing and a free end portion that extends toward the first wall of the housing;
a first weight coupled to a bottom surface of the free end portion of the first piezoelectric element, such that at least a portion of the first weight is disposed in the space of the housing; and a second weight coupled to a bottom surface of the free end portion of the second piezoelectric element, such that at least a portion of the second weight is disposed in the space of the housing, wherein the second piezoelectric element comprises a pair of elements that extend in a direction parallel to the first piezoelectric element, wherein the first piezoelectric element comprises a width W1, wherein the pair of elements of the second piezoelectric element comprises a width W2 and W3, respectively, and wherein W2+W3=1.5×W1.

8. A piezoelectric power generator comprising:

a box-shaped housing including first and second walls that oppose each other across a space of the housing, a first piezoelectric element having a fixed end portion that is fixed to the first wall of the housing and a free end portion that extends toward the second wall of the housing;

a second piezoelectric element having a fixed end portion that is fixed to the second wall of the housing and a free end portion that extends toward the first wall of the housing;

a first weight coupled to a bottom surface of the free end portion of the first piezoelectric element, such that at least a portion of the first weight is disposed in the space of the housing; and a second weight coupled to a bottom surface of the free end portion of the second piezoelectric element, such that at least a portion of the second weight is disposed in the space of the housing, wherein the second piezoelectric element comprises a pair of elements that extend in a direction parallel to the first piezoelectric element, wherein the first piezoelectric element comprises a width W1, wherein the pair of elements of the second piezoelectric element comprises a width W2 and W3, respectively, and wherein W1=W2+W3.

9. The piezoelectric power generator according to claim 1, wherein the first piezoelectric element is flexible such that the free end of the first piezoelectric element is positioned below the fixed end portion of the second piezoelectric element, and wherein the second piezoelectric element is flexible such that the free end of the second piezoelectric element is positioned below the fixed end portion of the first piezoelectric element.

10. The piezoelectric power generator according to claim 1, wherein a resonant frequency of bending vibration of the first piezoelectric element including the first weight and a resonant frequency of bending vibration of the second piezoelectric element including the second weight are the same.

11. The piezoelectric power generator according to claim 1, wherein the first piezoelectric element and the first weight and the second piezoelectric element and the second weight each comprise a symmetry line about a central axis in a width direction of the box-shaped housing.

12. The piezoelectric power generator according to claim 1, wherein each of the first and second piezoelectric elements decrease in width from the respective fixed end portions to the respective free end portions.

13. The piezoelectric power generator according to claim 1, wherein each of the first and second piezoelectric elements comprises a shape of an isosceles triangle.

14. The piezoelectric power generator according to claim 1, further comprising:

a first piezoelectric body coupled to at least one surface of the first piezoelectric element, and a second piezoelectric body coupled to at least one surface of the second piezoelectric element.

15. The piezoelectric power generator according to claim 14, wherein the first piezoelectric body is not coupled on a same surface of the first piezoelectric element where the first weight is coupled, and wherein the second piezoelectric body is not coupled on a same surface of the second piezoelectric element where the second weight is coupled.

16. The piezoelectric power generator according to claim 1, wherein the first piezoelectric element comprises a first plurality of cantilevered elements and the second piezoelectric element comprises a second plurality of cantilevered elements, wherein the first plurality of cantilevered elements and the second plurality of cantilevered elements interdigitate with each other in an alternating manner, wherein the first weight is coupled to respective bottom surfaces of each of the first plurality of cantilevered elements, and wherein the second weight is coupled to respective bottoms surfaces of the second plurality of cantilevered elements.

17. The piezoelectric power generator according to claim 16, wherein the first weight comprises a plurality of protrusions extending from an upper surface of the first weight, the plurality of protrusions of the first weight coupled to the first plurality of cantilevered elements, respectively, and wherein the second weight comprises a plurality of protrusions extending from an upper surface of the second weight, the plurality of protrusions of the second weight coupled to the second plurality of cantilevered elements, respectively.

18. The piezoelectric power generator according to claim 16, wherein each element of the first and second plurality of cantilevered elements comprises a shape of an isosceles triangle.

19. The piezoelectric power generator according to claim 1, further comprising a cap coupled to an upper surface of the box-shaped housing and configured to seal the box-shaped housing.

20. The piezoelectric power generator according to claim 1, wherein the first weight has a width greater than a width of the free end portion of the first piezoelectric element.

* * * * *